(12) United States Patent
Gaff et al.

(10) Patent No.: US 12,227,840 B2
(45) Date of Patent: Feb. 18, 2025

(54) SUBSTRATE SUPPORT WITH VARYING DEPTHS OF AREAS BETWEEN MESAS AND CORRESPONDING TEMPERATURE DEPENDENT METHOD OF FABRICATING

(71) Applicant: LAM RESEARCH CORPORATION, Fremont, CA (US)

(72) Inventors: Keith Gaff, Fremont, CA (US); Devin Ramdutt, Fremont, CA (US); Ann Erickson, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 179 days.

(21) Appl. No.: 17/880,855

(22) Filed: Aug. 4, 2022

(65) Prior Publication Data

US 2022/0380894 A1 Dec. 1, 2022

Related U.S. Application Data

(63) Continuation of application No. 15/363,558, filed on Nov. 29, 2016, now abandoned.

(51) Int. Cl.
*C23C 16/44* (2006.01)
*C23C 16/46* (2006.01)
(Continued)

(52) U.S. Cl.
CPC ........ *C23C 16/4411* (2013.01); *C23C 16/463* (2013.01); *C23C 16/505* (2013.01);
(Continued)

(58) Field of Classification Search
None
See application file for complete search history.

(56) References Cited

U.S. PATENT DOCUMENTS

| 4,357,006 A | 11/1982 | Hayes |
| 4,565,601 A | 1/1986 | Kakehi et al. |

(Continued)

FOREIGN PATENT DOCUMENTS

| GB | 2243022 B | 7/1994 |
| JP | H0718438 A | 1/1995 |

(Continued)

OTHER PUBLICATIONS

Machine Translation of JP 2006-049352 A (Year: 2006).*

(Continued)

*Primary Examiner* — Shamim Ahmed
*Assistant Examiner* — Bradford M Gates

(57) ABSTRACT

A method is provided and includes: determining a temperature distribution pattern across a substrate or a support plate of a substrate support; determining, based on the temperature distribution pattern, a number of masks to apply to a top surface of the support plate, where the number of masks is greater than or equal to two; and determining patterns of the masks based on the temperature distribution pattern; and applying the masks over the top surface. The method further includes: performing a first machining process to remove a portion of the support plate unprotected by the masks to form first mesas and first recessed areas between the first mesas; removing a first mask from the support plate; performing a second machining process to form second recessed areas and at least one of second mesas or a first seal band area; and removing a second mask from the support plate.

29 Claims, 9 Drawing Sheets

(51) Int. Cl.
*C23C 16/505* (2006.01)
*H01L 21/67* (2006.01)
*H01L 21/687* (2006.01)

(52) U.S. Cl.
CPC .. *H01L 21/67109* (2013.01); *H01L 21/67248* (2013.01); *H01L 21/6875* (2013.01)

(56) References Cited

U.S. PATENT DOCUMENTS

| | | | |
|---|---|---|---|
| 5,096,536 | A | 3/1992 | Cathey, Jr. |
| 5,160,152 | A | 11/1992 | Toraguchi et al. |
| 5,530,616 | A | 6/1996 | Kitabayashi et al. |
| 5,583,736 | A | 12/1996 | Anderson et al. |
| 5,609,720 | A | 3/1997 | Lenz et al. |
| 5,761,023 | A | 6/1998 | Lue et al. |
| 5,923,408 | A | 7/1999 | Takabayashi |
| 5,994,662 | A | 11/1999 | Murugesh |
| 6,028,762 | A | 2/2000 | Kamitani |
| 6,077,357 | A | 6/2000 | Rossman et al. |
| 6,083,344 | A | 7/2000 | Hanawa et al. |
| 6,170,428 | B1 | 1/2001 | Redeker et al. |
| 6,182,602 | B1 | 2/2001 | Redeker et al. |
| 6,189,483 | B1 | 2/2001 | Ishikawa et al. |
| 6,196,532 | B1 | 3/2001 | Otwell |
| 6,286,451 | B1 | 9/2001 | Ishikawa et al. |
| 6,320,736 | B1 | 11/2001 | Shamouilian et al. |
| 6,461,980 | B1 | 10/2002 | Cheung et al. |
| 6,506,291 | B2 | 1/2003 | Tsai et al. |
| 6,538,733 | B2 | 3/2003 | Gaal et al. |
| 6,628,503 | B2 | 9/2003 | Sogard |
| 6,682,603 | B2 | 1/2004 | Gondhalekar et al. |
| 6,768,627 | B1 | 7/2004 | Kitabayashi et al. |
| 6,785,115 | B2 | 8/2004 | Tsuruta et al. |
| 6,946,403 | B2 | 9/2005 | Kellerman et al. |
| 6,960,743 | B2 | 11/2005 | Hiramatsu et al. |
| 7,292,426 | B2 | 11/2007 | Ito et al. |
| 7,663,860 | B2 | 2/2010 | Nishimoto et al. |
| 7,869,184 | B2 | 1/2011 | Steger |
| 2002/0002008 | A1 | 1/2002 | Uher et al. |
| 2002/0036373 | A1 | 3/2002 | Kosakai |
| 2002/0130276 | A1 | 9/2002 | Sogard |
| 2002/0134511 | A1 | 9/2002 | Ushioda et al. |
| 2003/0049580 | A1 | 3/2003 | Goodman |
| 2004/0040665 | A1 | 3/2004 | Mizuno et al. |
| 2004/0163601 | A1 | 8/2004 | Kadotani et al. |
| 2004/0218340 | A1 | 11/2004 | Kitabayashi et al. |
| 2005/0152088 | A1 | 7/2005 | Ito et al. |
| 2006/0112881 | A1 | 6/2006 | Kaeppeler |
| 2007/0084847 | A1 | 4/2007 | Koshimizu et al. |
| 2007/0163504 | A1 | 7/2007 | Shimizu et al. |
| 2008/0289767 | A1 | 11/2008 | Tandou et al. |
| 2009/0056112 | A1 | 3/2009 | Kobayashi |
| 2009/0250202 | A1 | 10/2009 | Eibl |
| 2012/0139192 | A1 | 6/2012 | Ooi |
| 2014/0008020 | A1 | 1/2014 | Nagayama |
| 2014/0334806 | A1 | 11/2014 | Ranish et al. |
| 2015/0022935 | A1 | 1/2015 | Cox et al. |
| 2015/0022936 | A1 | 1/2015 | Cox et al. |
| 2015/0146339 | A1 | 5/2015 | Raj et al. |
| 2015/0225841 | A1 | 8/2015 | Wilby et al. |
| 2015/0262873 | A1* | 9/2015 | Chu ................. H01L 23/53295 257/773 |
| 2016/0118285 | A1 | 4/2016 | Takada |
| 2016/0230269 | A1 | 8/2016 | Raj et al. |
| 2018/0142352 | A1 | 5/2018 | Shah et al. |

FOREIGN PATENT DOCUMENTS

| | | |
|---|---|---|
| JP | H11209182 A | 8/1999 |
| JP | H11330219 A | 11/1999 |
| JP | 200649352 A | 2/2006 |
| JP | 2013153171 A | 8/2013 |
| KR | 20080029425 A | 4/2008 |

OTHER PUBLICATIONS

"A Mechanism of Stress-induced Metal Void in narrow Aluminum-based Metallization with the HPD CVD oxide dielectric," by Soo Geun Lee, Heok-Sang Oh, Sun-Rae Kim, Seung-Heon Song, Sun Hu Park, U-In Chung, and Geung Won Kang; U FAB Process, Semiconductor R&D Division, Samsung Electronics, 449-900, San 24 Nongseo-Ri, Kiheung-Eup Yongin-City, Kyungki-Do, Korea; 0-7803-5174-T/99/$10.00© 1999 IEEE (IITC 99-149).

Office Action issued in corresponding Taiwanese Patent Application No. 106141077 dated Aug. 6, 2021.

Office Action issued in corresponding Japanese Patent Application No. 2017-224113 mailed Nov. 16, 2021 (5 pages).

Office Action issued in corresponding Korean Patent Application No. 10-2017-0126866 dated Feb. 13, 2022.

* cited by examiner

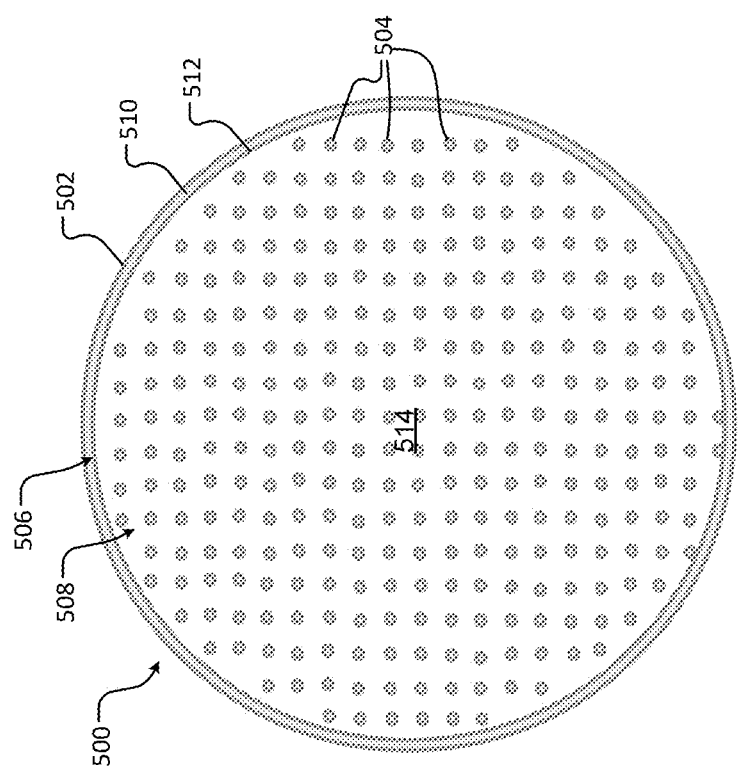
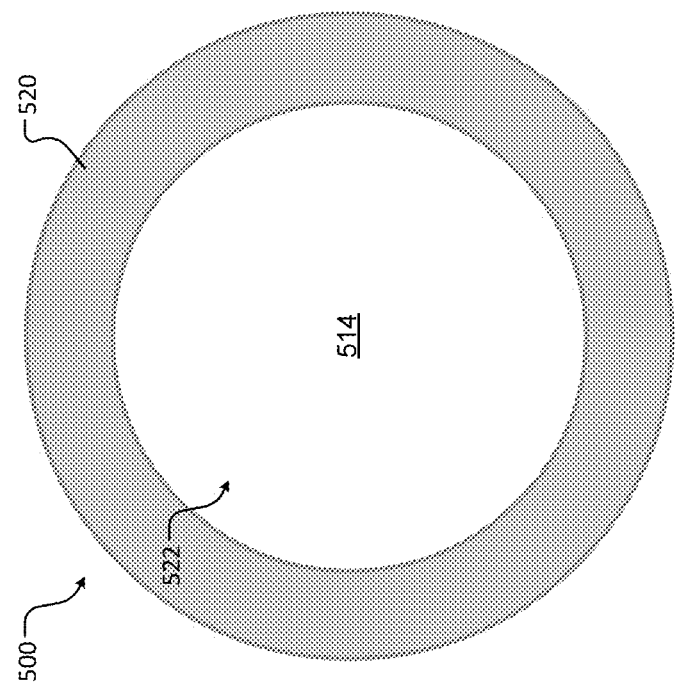
FIG. 6
FIG. 7

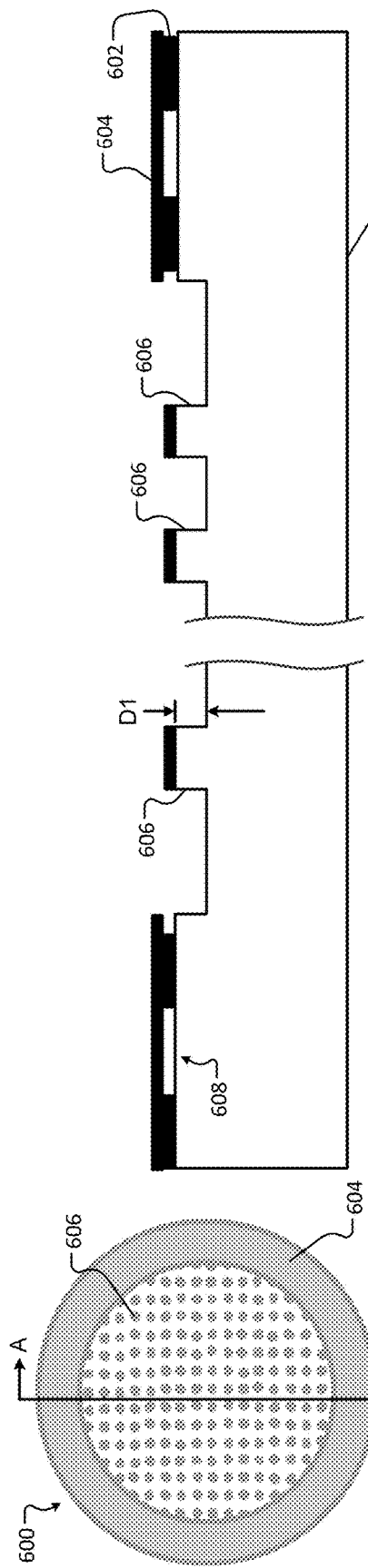
FIG. 9A
FIG. 9B
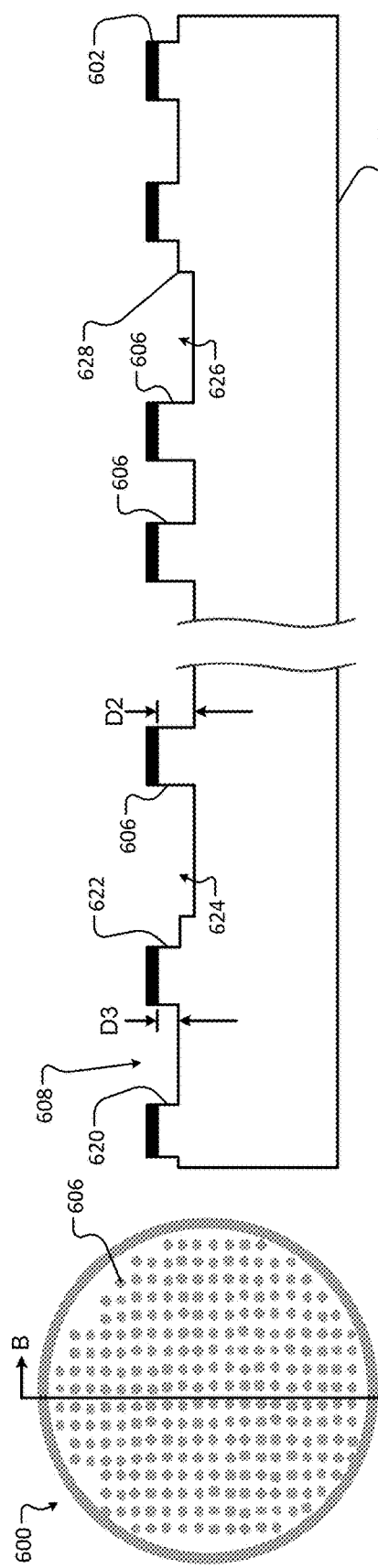
FIG. 10A
FIG. 10B

SUBSTRATE SUPPORT WITH VARYING DEPTHS OF AREAS BETWEEN MESAS AND CORRESPONDING TEMPERATURE DEPENDENT METHOD OF FABRICATING

CROSS-REFERENCE TO RELATED APPLICATIONS

This application is a continuation of U.S. patent application Ser. No. 15/363,558 filed on Nov. 29, 2016. The entire disclosure of the above application is incorporated herein by reference.

FIELD

The present disclosure relates to substrate supports of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a physical vapor deposition (PVD) process, an ion implantation process, and/or other etch, deposition, and cleaning processes. A substrate may be arranged on a substrate support such as a pedestal, an electrostatic chuck (ESC), etc. in a processing chamber of the substrate processing system. For example, during etching in a PECVD process, a gas mixture including one or more precursors is introduced into the processing chamber and plasma is struck to deposit a material on the substrate.

SUMMARY

A method is provided and includes: determining a temperature distribution pattern across a substrate or a support plate of a substrate support; determining, based on the temperature distribution pattern, a number of masks to apply to a top surface of the support plate, where the number of masks is greater than or equal to two; and determining patterns of the masks based on the temperature distribution pattern; and applying the masks over the top surface. The method further includes: performing a first machining process to remove a portion of the support plate unprotected by the masks to form first mesas and first recessed areas between the first mesas; removing a first one of the masks from the support plate; performing a second machining process to form second recessed areas and at least one of second mesas or a first seal band area; and removing a second one of the masks from the support plate.

In other features, a substrate support for a substrate processing system is provided. The substrate support includes a body and mesas. The mesas are distributed across and extend from and in a direction away from the body and are configured to support a substrate. Each of the mesas includes a surface area that contacts and supports the substrate. Each of the mesas has a same height relative to a bottom of the body. Depths of areas between the mesas vary in size according to a temperature distribution pattern of the substrate or a base plate of the substrate support and experienced during processing of the substrate.

In other features a method is provided and includes: determining a temperature distribution pattern across a substrate or a support plate of a substrate support; determining, based on the temperature distribution pattern, at least one of (i) rates at which a machining tool is to pass over the support plate, or (ii) periods of time the machining tool is to spend over corresponding areas of the support plate; and based on the determined rates or periods of time, moving the machining tool from a first position over the support plate to a second position over the support plate. The method further includes while moving the machining tool, machining a top surface of the support plate to provide mesas and a gradient in depths of recessed areas between the first position and the second position, where the mesas have a same height relative to a bottom of the support plate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 is a top view of an example of a substrate support including a seal band and mesas in accordance with an embodiment of the present disclosure;

FIG. 7 is a top view of an example of a mask over a portion of a substrate support in accordance with an embodiment of the present disclosure;

FIG. 9A is a top view of an example of a support plate on which multiple masks are applied in accordance with an embodiment of the present disclosure;

FIG. 9B is a side cross-sectional view along a plane represented by line A-A in FIG. 9A;

FIG. 10A is a top view of the support plate of FIG. 9A after one of the masks has been removed;

FIG. 10B is a side cross-sectional view along a plane represented by line B-B of FIG. 10A.

In the drawings, reference numbers may be reused to identify similar and/or identical elements.

DETAILED DESCRIPTION

Figure 1:
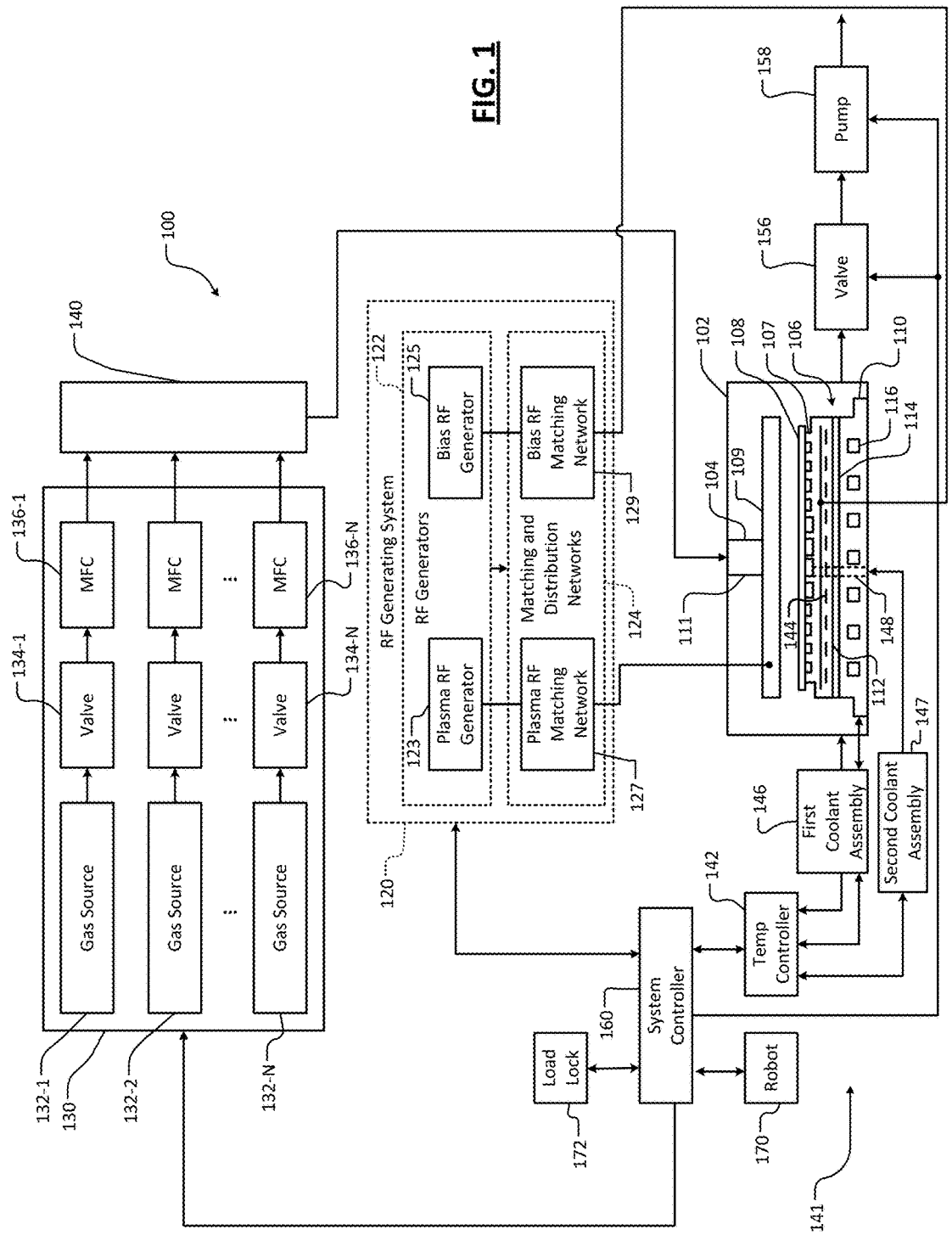
FIG. 1 is a functional block diagram of an example of a substrate processing system incorporating a substrate support in accordance with an embodiment of the present disclosure.

In high-power etch chambers, a substrate support is used to maintain a predetermined temperature of a substrate in presence of plasma. The substrate support dissipates heat associated with power provided. The more uniform the heat dissipation is across the substrate during an etch process, the better the results of the etch process. During an etch process, a substrate is held within a dielectric etch chamber on a substrate support, where the substrate is heated up by a predetermined temperature in presence of high-power plasma. Due to non-uniformities associated with the plasma and cooling of the substrate support, an average temperature across the substrate can vary, for example, by 5-20° C., depending on plasma input power. How temperature sensitive a substrate process is due to process variations effects whether resultant substrates satisfy predetermined build requirements. For this reason, these process variations can negatively affect yield of a substrate process that is highly sensitive to changes in temperature.

One technique to reduce temperature sensitivity and/or improve temperature uniformity of a substrate includes providing a pattern of cooling via fluid channels within a substrate support to maximize temperature uniformity. Another technique to reduce temperature sensitivity and/or improve temperature uniformity of a substrate includes uniformly forming a thermal bond layer between a dielectric layer and a baseplate of a substrate support. These two techniques are limited. A cooling channel pattern of a substrate support is limited by (i) dimensions and configurations of a baseplate of the substrate support, (ii) layout of electrical connections including heating elements and/or sensors within the substrate support, and (iii) and cooling gas feedthroughs, which restrict available positions for cooling fluid channels. Also, since a temperature of a cooling fluid changes as the cooling fluid passes through a baseplate of a substrate support, cold spots near coolant inlet(s) and hot spots near coolant outlet(s) can occur. Thickness of the thermal bond layer cannot be locally controlled, for example, to compensate for cold spots and hot spots associated with the coolant inlet(s) and/or coolant outlet(s). Due to the limited effects associated with adjusting the coolant channel pattern and the thickness of the thermal bond layer, 5-20° C. temperature variation across a substrate can exist for high-power etch chambers.

The examples set forth below include substrate supports designed to improve uniformity of temperatures across a substrate (sometimes referred to as "within-wafer temperatures"). Heights of mesas and seal bands and depths of areas between mesas are set to compensate for non-uniformities, such as non-uniformities in (i) a plasma pattern across a substrate, referred to as "chamber uniformity", and (ii) cooling of the substrate. A plasma pattern across a substrate may refer to plasma concentration levels across the substrate and is directly related to a heating pattern of the substrate.

FIG. 1 shows an example substrate processing system 100 that processes substrates using RF plasma. Although FIG. 1 shows a capacitive coupled plasma (CCP) system, the embodiments disclosed herein are applicable to transformer coupled plasma (TCP) systems, electron cyclotron resonance (ECR) plasma systems, inductively coupled plasma (ICP) systems and/or other systems and plasma sources that include a substrate support. The embodiments are applicable to physical vapor deposition (PVD) processes, plasma enhanced chemical vapor deposition (PECVD) processes, chemically enhanced plasma vapor deposition (CEPVD) processes, ion implantation processes, and/or other etch, deposition, and cleaning processes.

The substrate processing system 100 includes a processing chamber 102. The processing chamber 102 encloses other components of the processing chamber 102 and contains the RF plasma. The processing chamber 102 includes an upper electrode 104 and a substrate support 106 (e.g., an ESC). During operation, a substrate 108 is arranged on a substrate support 106. The substrate support 106 includes minimum contact area (MCA) features 107. Each of the MCA features 107 may be referred to as a "mesa". The mesas 107 are distributed across a top portion (or portion nearest the substrate 108) of the substrate support 106 and extend upwards away from a baseplate 110 of the substrate support 106. The mesas 107 support and contact a backside of the substrate 108. The substrate 108 may be electrostatically clamped onto the substrate support 106. The mesas 107 may be integrally formed as part of a dielectric layer, a semi-conductive layer, or a top metallic layer of the substrate support 106. The substrate support 106 may include any number of mesas.

As further described below, contact surface area of the mesas 107 relative to the substrate 108 may increase with radius of the substrate support 106 (or distance away from a center of the substrate support 106) and thus with radius of the substrate 108 (or distance away from a center of the substrate 108). This is because the substrate 108 is centered on the substrate support. The diameter, surface area, size and/or quantity of the mesas may increase per unit area of a top lateral surface of the substrate support 106 as a radial distance from a center of the substrate support 106 increases. In one embodiment, the contact surface area and the number of mesas does not change as a radial distance from a center of the substrate support 106 increases. The mesas 107 may be cylindrically-shaped as shown in FIGS. 6, 9A and 10A and/or may be shaped differently (e.g., hemi-spherically-shaped or semi-spherically-shaped). Structure and formation of the mesas 107 are further described below with respect to FIGS. 2-12.

For example only, the upper electrode 104 may include a showerhead 109 that introduces and distributes gases. The showerhead 109 may include a stem portion 111 including one end connected to a top surface of the processing chamber 102. The showerhead 109 is generally cylindrical and extends radially outward from an opposite end of the stem portion 111 at a location that is spaced from the top surface of the processing chamber 102. A substrate-facing surface of the showerhead 109 includes holes through which process or purge gas flows. Alternatively, the upper electrode 104 may include a conducting plate and the gases may be introduced in another manner.

The substrate support 106 includes the conductive baseplate 110 that acts as a lower electrode. The baseplate 110 supports a support plate 112, which may be formed at least partially of a ceramic material. In a high-power dielectric etch embodiment, the support plate 112 is not a heating plate. In a low-power conductor etch embodiment, the support plate 112 may be a heating plate. A thermal resistance layer 114 may be arranged between the support plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrode 104 and/or the baseplate 110. As an example, a plasma RF generator 123, a bias RF generator 125, a plasma RF matching network 127 and a bias RF matching network 129 are shown. The plasma RF generator 123 may be a high-power RF generator producing, for example 6-10 kilo-watts (kW) of power.

A gas delivery system 130 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

The substrate processing system 100 includes a cooling system 141 that includes a temperature controller 142 may be connected to TCEs 144 (sometimes referred to as actuators) arranged in the support plate 112. In one embodiment, the TCEs 144 are not included. Although shown separately from a system controller 160, the temperature controller 142 may be implemented as part of the system controller 160. As an example, the TCEs 144 may include, but are not limited to, respective macro TCEs (or first array of TCEs) corresponding to each macro zone of the support plate 112 and/or micro TCEs (or second array of TCEs) corresponding to each micro zone of the support plate 112. The macro TCEs may be used for coarse tuning temperatures and/or other fields of macro zones of the support plate 112. The micro TCEs may be used for fine tuning temperatures and/or other fields of micro zones of the support plates. The macro zones may include the micro zones. One or more micro zones may overlap two or more of the macro zones. The macro zones and the micro zones may have predetermined, matching, different, or any arbitrary shape.

The support plate 112 includes multiple temperature controlled zones (e.g., 4 zones, where each of the zones includes 4 temperature sensors). Each of the temperature controlled zones has corresponding macro and/or micro TCEs. The macros TCEs are controlled to roughly achieve selected temperatures in each of the respective temperature controlled zones. The micro TCEs may be individually controlled to finely adjust temperatures within the respective temperature controlled zones and/or to compensate for temperature non-uniformities in each temperature controlled zone. For example, for each set point temperature of a macro TCE, a temperature distribution response across a top surface of the support plate 112 may be known and mapped (i.e., stored in memory). Similarly, a temperature distribution response of each of the micro TCEs across the surface of the support plate 112 may be known and mapped. Although the systems and methods disclosed herein are described with respect to multi-zone support plates and/or unheated ESCs, the principles of the present disclosure may be applied to other temperature-controlled components of a substrate processing system.

The temperature controller 142 may control operation and thus temperatures of the TCEs 144 to control temperatures of the substrate support 106 and a substrate (e.g., the substrate 108) on the substrate support 106. The temperature controller 142 may communicate with (i) a first coolant assembly 146 to control flow of a first coolant (pressures and flow rates of a cooling fluid) through the channels 116, and (ii) a second coolant assembly 147 to control flow of a second coolant (e.g., pressures and flow rates of a cooling gas) through other channels (one channel 148 is shown) and through areas between mesas 107. The first coolant assembly 146 may receive a cooling fluid from a reservoir (not shown). The second coolant assembly 147 may receive gas from the manifold 140. For example, the coolant assembly 146 may include a coolant pump and reservoir. The temperature controller 142 operates the coolant assembly 146 to selectively flow the coolant through the channels 116 to cool the substrate support 106 and the support plate 112. The temperature controller 142 may control the rate at which the coolant flows and a temperature of the coolant. The temperature controller 142 controls current supplied to the TCEs 144 and pressure and flow rates of coolant supplied to channels 116 based on detected parameters from sensors within the processing chamber 102. During an etch process, the substrate 108 may heat up by a predetermined temperature (e.g., 120 degrees Celsius (° C.)) in presence of high-power plasma. Flow of coolant through the channels reduces temperatures of the substrate support 106, which reduces temperatures of the substrate 108 (e.g., cooling from 120 C to 80 C).

A valve 156 and pump 158 may be used to evacuate reactants from the processing chamber 102. The system controller 160 may control components of the substrate processing system 100 including controlling supplied RF power levels, pressures and flow rates of supplied gases, RF matching, etc. The system controller 160 controls states of the valve 156 and the pump 158. A robot 170 may be used to deliver substrates onto, and remove substrates from, the substrate support 106. For example, the robot 170 may transfer substrates between the substrate support 106 and a load lock 172. The robot 170 may be controlled by the system controller 160. The system controller 160 may control operation of the load lock 172.

Figure 2:
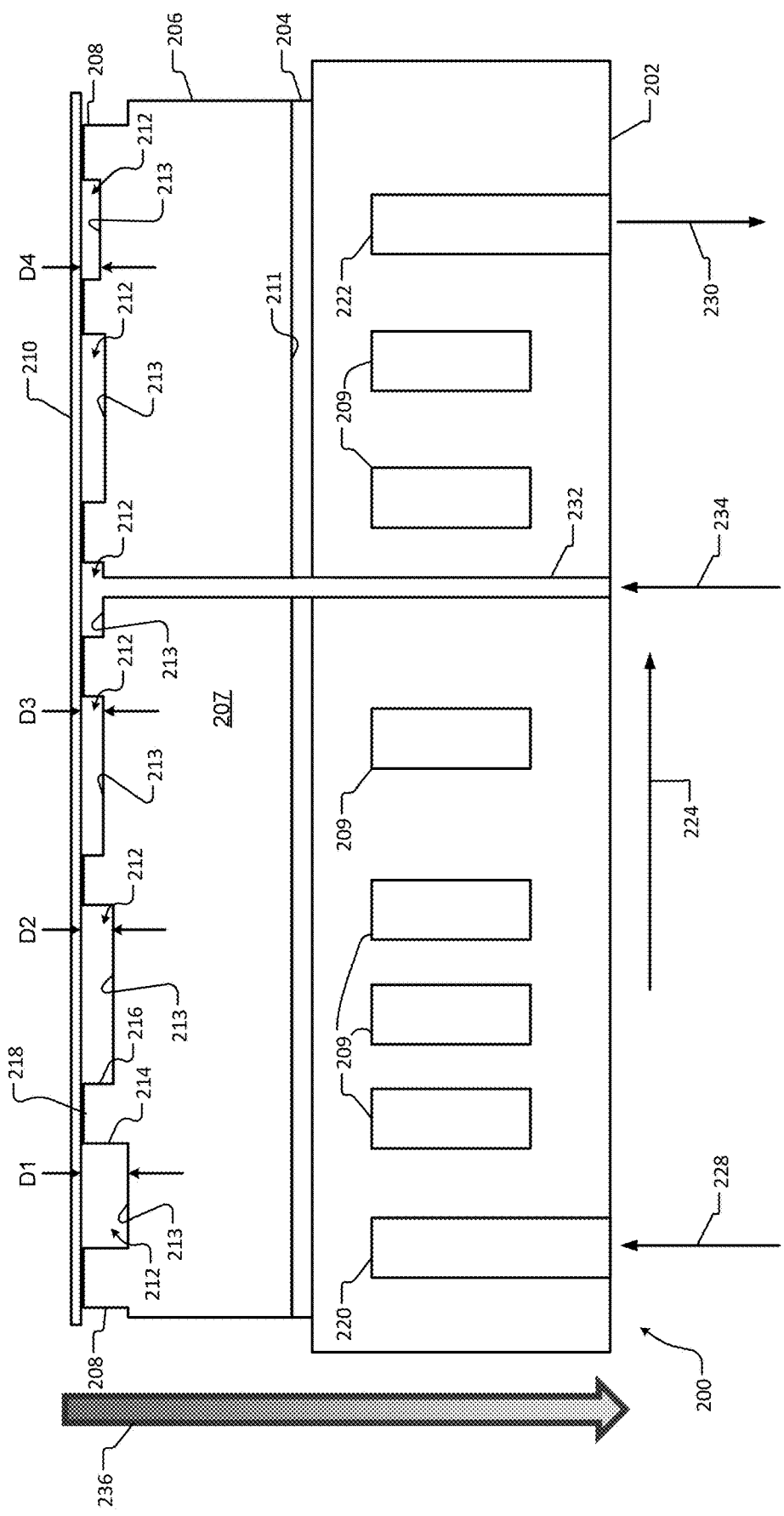
FIG. 2 is a side cross-sectional view of an example of an electrostatic chuck including a substrate support in accordance with the present disclosure.

FIG. 2 shows a substrate support 200 that includes baseplate 202, a thermal bond layer 204 and a support plate 206. The support plate 206 may be an uppermost layer of the substrate support 200. The support plate 206 includes a body 207 and mesas 208 and may include electrodes and/or heating elements similar to the support plate 112 of FIG. 1. A substrate 210 is disposed on and is in contact with top contact surfaces of the mesas 208. The mesas 208 may be an uppermost layer of the support plate 206. The mesas 208 are configured to provide the same average temperature across the support plate 206 and thus the substrate 210 while minimizing temperature variability due to non-uniformities associated with cooling of the substrate support 200 and plasma in a plasma chamber.

In one embodiment, the mesas 208 have a same height relative to a bottom (or a bottom surface) 211 of the support plate 206, such that uppermost surfaces of the mesas 208 are at a same level. Distances between the uppermost surfaces of the mesas 208 and a bottom surface of the body 207 are the same across the support plate 206. Depths of areas 212 above recessed surfaces 213 and between the mesas 208 may vary, as shown. Also, lengths of vertical sides of certain ones of the mesas 208 may vary, whereas lengths of vertical sides of other ones of the mesas may not vary. The lengths refer to vertical dimensions of the sides of the mesas 208. As an example, the lengths (or vertical dimensions) of the sides 214, 216 of the mesa 218 are different. For example, the length of the side 214 is D1 and the length of side 216 is D2. Although depths D1-D4 are shown, any number of different depths may exist between the mesas 208. As an example, the depths may decrease in size radially across the support plate 206 from a first location located above a coolant channel inlet 220 to a second location located above a coolant channel outlet 222, as indicated by arrow 224.

The baseplate 202 may include an electrode, heating elements, coolant channels (e.g., cooling channels 209 are shown), etc. similar to the baseplate 110 of FIG. 1. Coolant is received at the coolant channel inlet 220 as shown by arrow 228 and is output from the baseplate 202 at the coolant channel outlet 222, as shown by arrow 230. Although a single coolant channel inlet and a single coolant channel outlet are shown, any number of each may be included. Also, although the coolant channel inlet 220 and the coolant channel outlet 222 are shown as being near a perimeter of the baseplate 202, the coolant channel inlet 220 and coolant channel outlet 222 may be in other locations. See, for example, FIG. 5.

The depths of the areas 212 between the mesas 208 may be smaller near and over a coolant channel outlet and larger near and over a coolant channel inlet, as shown. This allows for a higher-volume of a cooling gas (e.g., helium) to be passed over the areas between the mesas 208 having the larger depths than the areas between the mesas 208 having the smaller depths. The larger volume of cooling gas provides additional cooling. The cooling gas may be provided and return via channels (one channel 232 is shown) in the base plate 202, thermal bond layer 204 and support plate 206. The gas being input to the channel 232 is shown by arrow 234. The mesas 208 may be zoned to include two or more zones receiving cooling gas at different pressures. An example of this is shown and described with respect to FIGS. 6 and 8. Arrow 236 indicates that thermal energy is transferred from the substrate 210 and through the substrate support 200, such that temperatures of the substrate support 200 generally decrease from the mesas 208 to the base plate 202.

As an example, the support plate 206 may be formed of ceramic and/or other suitable dielectric material. The thermal bond layer 204 may include an adhesive material. The base plate 202 may be formed of aluminum and/or other suitable material. The support plate 206 is cooled by the base plate 202 via the thermal bond layer 204. Heat is transferred from the substrate 210 to the support plate 206 and from the support plate 206 to the base plate 202, which is cooled by the cooling fluid passing through the channels 209 in a pattern defined by the channels 209. Non-uniformities in temperatures of a substrate can be associated with each step in a cooling process. For example, non-uniformities can be associated with: a cooling channel in a baseplate, a thermal bond layer and a corresponding thermal bond provided between a support plate and a base plate; and/or a thickness of the support plate. Configurations of mesas and depths of areas between the mesas disclosed herein minimize the effects of non-uniformities on temperature variation across at least an upper portion of the corresponding support plates and thus across substrates disposed thereon.

Figure 3:
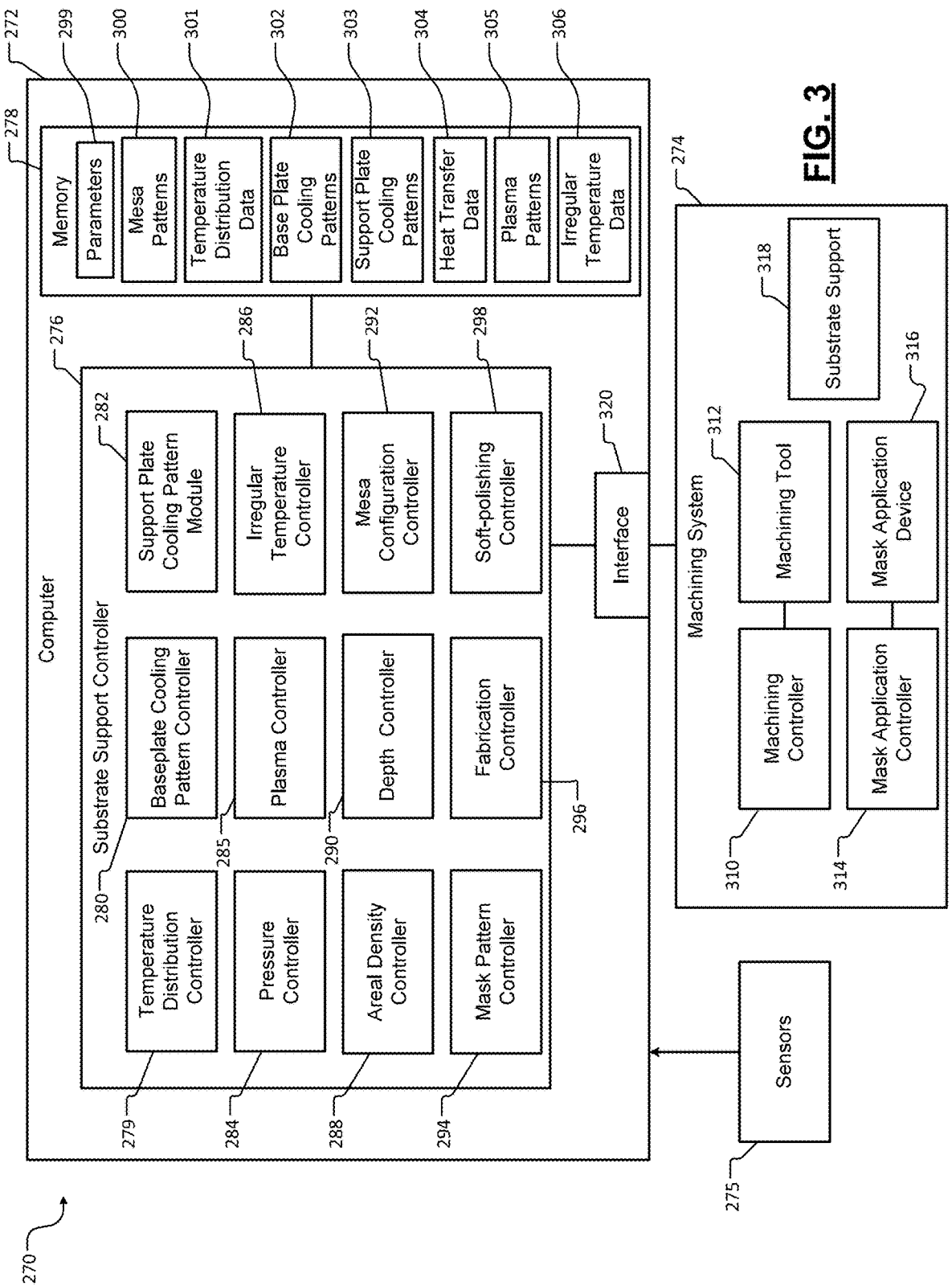
FIG. 3 is an example of a substrate support manufacturing system including a substrate support controller in accordance with an embodiment of the present disclosure.

FIG. 3 shows a substrate support manufacturing system 270 that includes a computer 272, a machining system 274, and sensors 275. The computer 272 includes a substrate support controller 276 and a memory 278. The substrate support controller 276 may include a temperature distribution controller 279, a baseplate cooling pattern controller 280, a substrate support cooling pattern module 282, a pressure controller 284, a plasma controller 285, an irregular temperature controller 286, an areal density controller 288, a depth controller 290, a mesa configuration controller 292, a mask pattern controller 294, a fabrication controller 296 and a soft-polishing controller 298. Operation of the controllers 278, 280, 282, 284, 286, 288, 290, 292, 296, 298 is described below with respect to the method of FIG. 4.

The memory 278 stores parameters 299, mesa patterns 300, temperature distribution data 301, base plate cooling patterns 302, support plate cooling patterns 303, heat transfer data 304, plasma patterns 305, irregular temperature data 306, etc. The parameters 299, patterns 300, 302, 303, 305, and data 301, 304, and 306 may correspond to models of substrate supports and/or be stored as part of tables and include historical, predetermined, estimated and/or simulated values. The historical, predetermined, estimated and/or simulated values may be for one or more substrate supports operating according to one or more processing system recipes.

Figure 4:
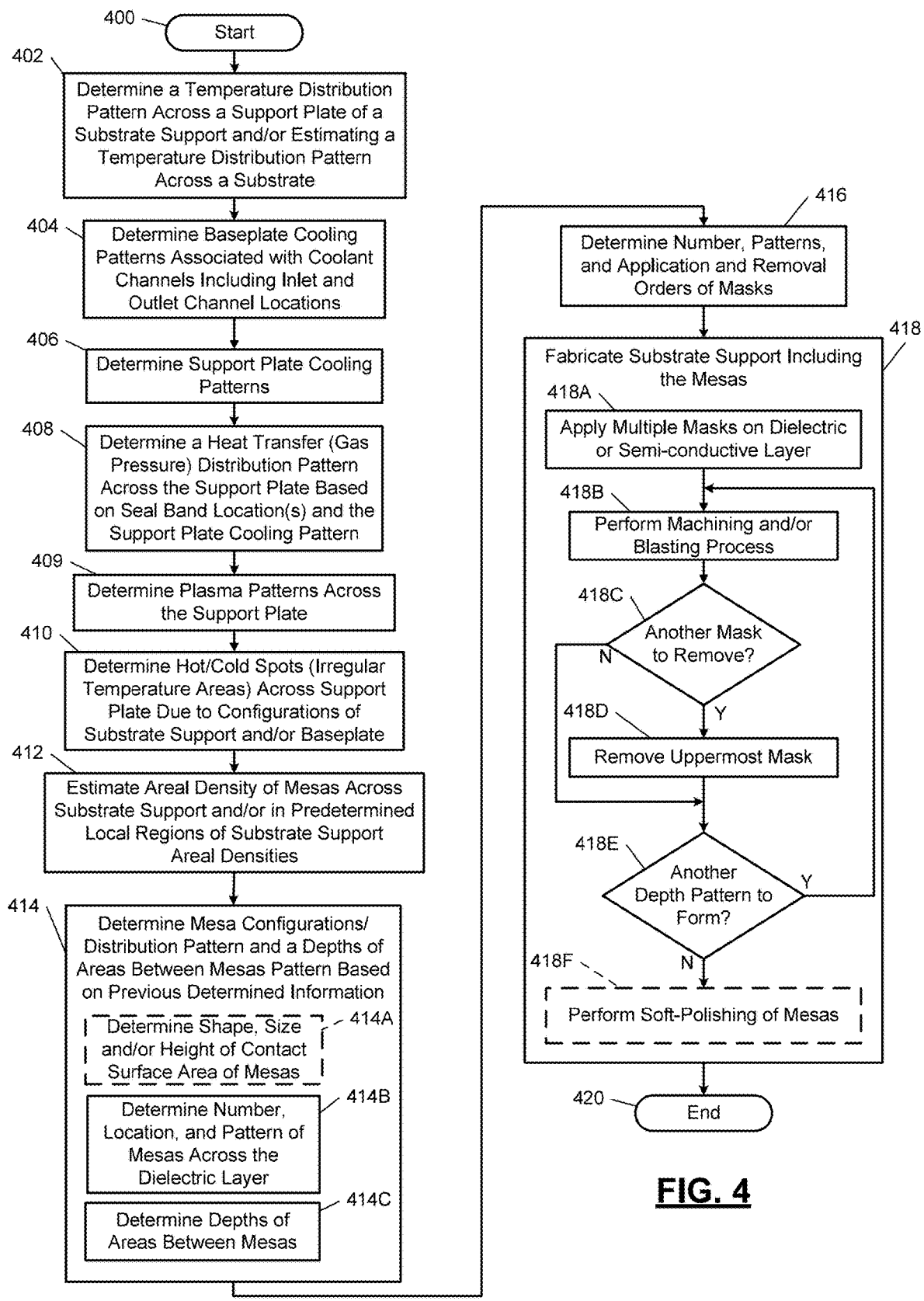
FIG. 4 an example substrate support fabrication method in accordance with an embodiment of the present disclosure.

The parameters 299 may include parameters detected by sensors of the processing system 100 of FIG. 1 and/or parameters used, estimated and/or determined during the method of FIG. 4. The sensors 275 may include the sensors of the processing system 100 of FIG. 1, a temperature sensing array, a heat flux probe, an in-chamber infrared camera, and/or other sensors disclosed herein. The mesa patterns may include: shapes and sizes of contact surface areas of mesas; numbers of mesas in each predetermined local region of substrate supports; heights of mesas; locations (or layout) of mesas across substrate supports; areal densities of the predetermined local regions; and/or areal density variation from centers to peripheral edges of the substrate supports.

The temperature distribution data 301 may include temperatures across a support plate and/or a substrate. The base plate cooling patterns 302 may include values indicative of levels of cooling provided across a base plate. The support plate cooling patterns 303 may include values indicative of levels of cooling provided across a support plate. The heat transfer data 304 may include values indicative of amounts of heat transfer across a support plate as a result of passing a cooling gas in areas between mesas of the support plate. The plasma patterns 305 may include concentration levels, voltages and/or power levels of plasma across a substrate. The irregular temperature data 306 may indicate where cold/hot spots are located across a support plate and temperatures of the cold/hot spots. The patterns and data described above may refer to (i) predetermined values, and/or (ii) measured, estimated and/or actual values existing during processing of a substrate.

The machining system 274 may include a computer numerical control (CNC) milling machine, a knurling machine, a molding machine, a casting machine, a three-dimensional (3D) printer, and/or other machines and/or devices suitable for fabricating a substrate support. The machining system 274 may include a machining controller 310, a machining tool 312, a mask application controller 314, and a mask application device 316 used to fabricate a substrate support 318. The machining controller 310 and the mask application controller 314 may receive the parameters 299, the patterns 300, 302, 303, 305 and data 301, 304, 306 from the computer 272 via an interface 320. The controllers 310, 314 control operation of the machining tool 312 and the mask application device 316 to fabricate the substrate support 318. The machining tool 312 may include a CNC milling tool and/or other suitable machining tool.

For further defined structure of the controllers of FIGS. 1 and 3 see below provided method of FIG. 4 and below provided definition for the term "controller". The systems disclosed herein may be operated using numerous methods, an example method is illustrated in FIG. 4. In FIG. 4, a substrate support fabrication method is shown. Although the following operations are primarily described with respect to the implementations of FIGS. 2-10B and 12, the operations may be easily modified to apply to other implementations of the present disclosure. The operations may be iteratively performed.

The method may begin at 400. At 402, the temperature distribution controller 278 may determine (i) a temperature distribution pattern across a substrate support plate (e.g., the support plate 206 or other support plate disclosed herein) of a substrate support, and/or (ii) estimate a temperature distribution pattern of a substrate. This may provide the temperature distribution data 301 stored in the memory 278. The temperature distribution data may be determined using, for example, a heat flux probe and/or temperature sensors located on and/or within the support plate and running a test to detect the temperatures. In addition and/or as an alternative, an in-chamber infrared camera may be used to detect temperatures and provide the temperature distribution data under an applied heat load.

At 404, the baseplate cooling pattern controller 280 may determine base plate cooling patterns associated with cooling channels in a base plate of the substrate support. This may provide the base plate cooling patterns 302 stored in the memory 278.

Figure 8:
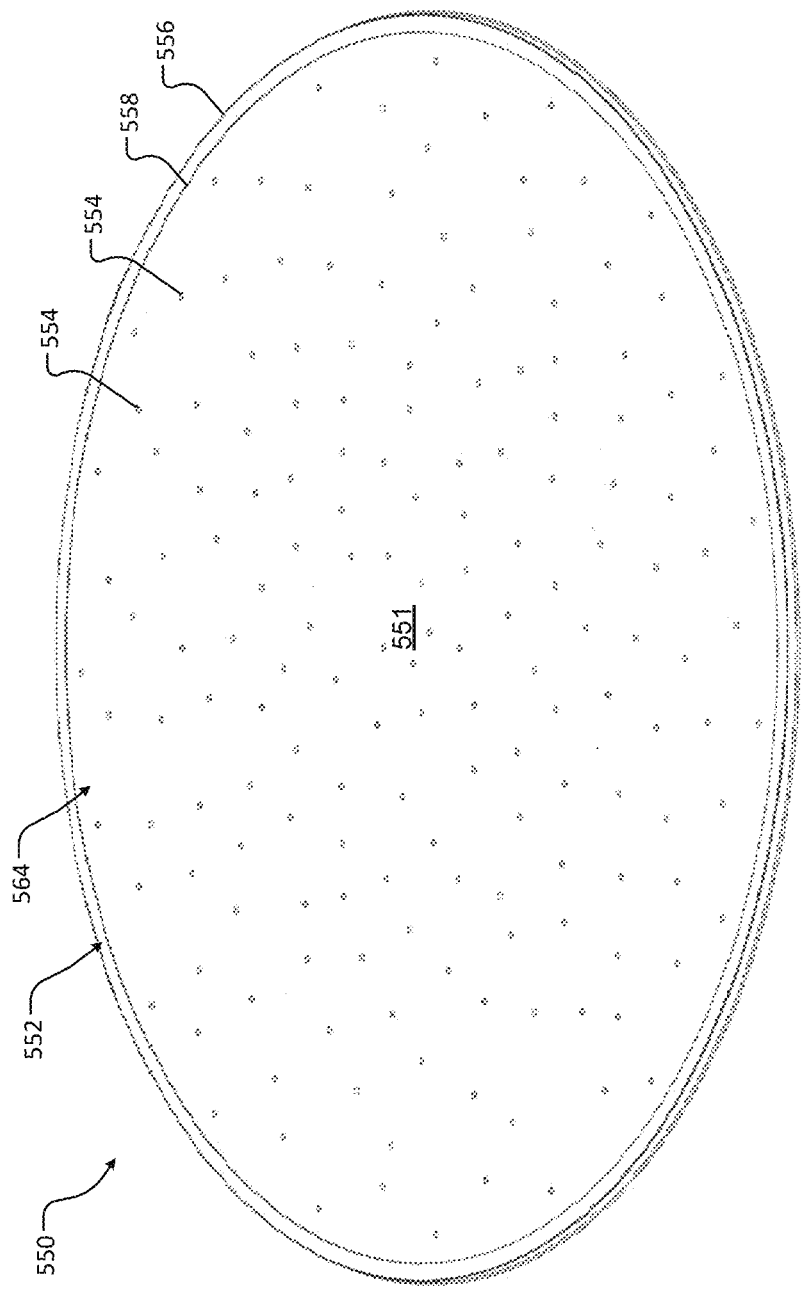
FIG. 8 is a top perspective view of an example of a top surface area of a support plate of a substrate support in accordance with an embodiment of the present disclosure.

At 406, the substrate support cooling pattern module 282 may determine support plate cooling patterns, in conjunction with the uniformity pattern of any thermal resistance material between the cooling channels and the support plate. This may include (i) uniform and/or non-uniform cooling patterns in areas between mesas, and/or (ii) uniform and/or non-uniform cooling patterns in areas between seal bands. Example seal band areas are shown in FIGS. 6 and 8. Operation 406 may provide the support plate cooling patterns 303 stored in the memory 278. If the support plate, itself does not contain a heater, an external heat load may be applied, to measure uniformity of cooling.

At 408, the pressure controller 284 may determine a heat transfer distribution pattern associated with gas distribution, heat transfer, and/or gas pressures in areas between mesas of the substrate support and/or in seal band areas. The substrate support may include one or more seal band areas. Gas pressures in the seal band areas may be different than gas pressures (i) outside the seal band areas, and (ii) in areas between mesas of the support plate. Each seal band area may have a respective gas pressure. Operation 408 may provide the heat transfer data 304.

At 409, the plasma controller may determine plasma patterns across the support plate. This may provide the plasma patterns 305 stored in the memory 278. At 410, the irregular temperature controller 286 may identify cold spots and/or hot spots in the support plate. This may provide the irregular temperature data 306 stored in the memory 278.

At 412, the areal density controller 288 determines areal densities of the mesas across the substrate support and/or in predetermined local regions of the substrate support. Areal density of mesas refers to a total contact area of the mesas in a local region of a substrate support. For example, areal density for a local contact region of the support plate is equal to a total contact area of the top surface areas of the mesas that are within the local region divided by an area of the local region. For example, the areal density for the local region is equal to (i) a sum of portions of the areas a-d of the mesas within the local region, divided by (ii) the area of the local region (or $$\frac{a+b+c+d}{\pi r_1^2}\Bigg),$$

where $r_1$ is the radius of the local region. Portions of the areas a-d that are not in the identified local region are not included in the sum.

The mesas may be scaled and configured, such that areal densities of the mesas increase monotonically and/or linearly with radius of the substrate support. The areal density controller 288 may estimate the areal density $\gamma$ for one or more local regions. Equation 1 may be used to estimate the areal density $\gamma$, where $A_{MCA}$ is the total mesa contact surface area within the corresponding local region, and $A_o$ is the total lateral local surface area of the corresponding local region.

$$\gamma = \frac{A_{MCA}}{A_o} \qquad (1)$$

In one embodiment, the areal density of a substrate support increases from a center of the substrate support to an outer and/or outermost peripheral edge of the substrate support. The areal density may increase monotonically and/or linearly as a radial distance from a center of the substrate support increases. In one embodiment, substrate contact surface areas and/or diameters of the mesas increase in size from a center to the peripheral edge and thus increase with radius of the substrate and/or the substrate support. Alternatively or in addition to having the sizes of the contact surface areas of the mesas increasing with radius, the number of mesas per unit top lateral surface area of the substrate and/or per local region of the substrate support may also increase with radius of the substrate and/or the substrate support.

At 414, the mesa configuration controller 292 determines mesa configurations and/or a mesa pattern for the mesas of the substrate support including determining depths of areas between the mesas. At 414A, the mesa configuration controller 292 may determine shapes and sizes of contact surface areas of the mesas based on the one or more determined areal densities. The mesas may be cylindrically-shaped, hemi-spherically-shaped, or semi-spherically-shaped and/or may have other shapes. The mesas may be uniformly shaped or may have different shapes. The substrate surface areas of the mesas may increase, such that mesas further way from a center of the substrate have larger substrate surface areas than mesas closer to the center of the substrate. In addition or alternatively, the number of mesas may increase with increase in radius of the substrate support. Operation 414A, may include the mesa configuration controller 292 determining heights of the mesas.

At 414B, the mesa configuration controller 292 determines number, location and pattern of the mesas across the substrate support. Different patterns of increasing areal density may be implemented depending on the amount of substrate expansion due to different process RF power levels and conditions. Each of these patterns may include monotonically and/or linearly increasing areal density with substrate support radius to provide minimal and uniform wear across the substrate including minimizing contact pressure between the substrate and the substrate support and stress concentrations at upper peripheral edges of the mesas.

Sizes and shapes of areas between mesas and/or the radii of the local regions of the substrate support may be minimized and/or set to minimize vertical deflections of the substrate in the areas and/or local regions. The sizes and shapes of the areas between mesas and/or the radii of the local regions of the substrate support may be set based on or in a manner to be compatible with determined radii of the outer peripheral edges of the mesas. The determined radii of the outer peripheral edges of the mesas may be determined at 414A based on the sizes and shapes of the areas between mesas and/or the radii of the local regions of the substrate support.

At 414C, the depth controller 290 determines depths of areas between the mesas. This may be accomplished based on the information determined during operations 402, 404, 406, 408, 409, 410, 412, 414A, and/or 414B. The depths may be indirectly proportional to temperatures of the support plate. For example, the depths are greater for areas experiencing low temperatures than for areas experiencing high temperatures, to compensate for non-uniformities in cooling capacity in the presence of an external heat load. In one embodiment, the depths decrease in size in a direction across the support plate from a coolant inlet to a coolant outlet. In one embodiment, this decrease is from a first point along a perimeter of the support plate and radially across the support plate to a second point along the perimeter of the support plate. In another embodiment, this decrease is from a center of the support plate radially outward to a point near a perimeter of the support plate.

At 416, the mask pattern controller 294 determines one or more mask patterns to be used to form the mesas. This may be based on the information provided during operation 414 including the size, shape, height, and locations of the mesas and the depths of the areas between the mesas. The number of masks, the patterns of the masks, and the application and removal orders of the masks are determined.

The parameters determined during operations 402, 404, 406, 408, 410, 412, 414, and 416 are related and thus altering one of the parameters can affect values of the other parameters. Iterative performance of these operations allows the parameters to be adjusted until further changes in these parameters negligibly change estimated values of vertical deflection, wear depth, localized stress, etc. The parameters may be iteratively adjusted until changes in values of vertical deflection, wear depth, localized stress, etc. are within predetermined ranges. The parameters may also be adjusted until estimated and/or resultant temperatures across the support plate are within predetermined ranges and/or until estimated and/or resultant temperatures across a substrate, a temperature sensing array, or a heat flux probe are within predetermined ranges. The parameters may also be adjusted until an average estimated and/or resultant temperature across a substrate, a temperature sensing array, or a heat flux probe is within a predetermined range. A temperature sensing array and/or a heat flux probe may be placed on the support plate and used to detect temperatures that would be experienced by a substrate during a plasma process. In another embodiment, the support plate may include temperature sensors to detect temperatures across the support plate, which may be used to detect and/or estimate temperature across the support plate and a substrate.

At 418, the fabrication controller 296 sends parameters for the substrate support, as determined during operations 402, 404, 406, 408, 410, 412, 414, 416, 418 to the machining system 274. The controllers 310, 314 control operation of the machining tool 312 and the mask application device 316 to form the substrate support and/or a layer (e.g., an upper most layer) of the substrate support including the mesas and the areas between the mesas. The layer is formed to have mesas in a mesa pattern as determined at 414.

At 418A, the one or more masks are applied on a top surface of the support plate. In one embodiment, two masks are formed. The second mask is applied over a portion of the first mask and the support plate. An example showing use of two masks is shown and described with respect to FIGS. 9A, 9B, 10A, 10B. In another embodiment, three or more masks are formed. An example showing use of 5 masks is shown and described with respect to FIG. 11. The masks protect surfaces of the support plate below the masks during machining of the support plate. The masks may overlap each other or may cover distinct areas of the support plate. The masks prevent areas of the support plate under the masks from being etched during for example operation 418B. As an example, the masks may be formed of an elastic resin material such as a urethane resin.

At 418B, the machining tool 312 performs a machining and/or blasting process to form a first depth pattern including at least a portion of some or all of the areas between mesas. This process is based on the information provided during operation 414 including specifications of the mesas and the depths of the areas between the mesas. The machining and/or blasting process may include, for example, sand blasting, grit (or bead) blasting, laser machining, and/or other technique used to remove material of the support plate unprotected by the one or more masks. In one embodiment, the machining tool 312 is a bead blasting tool and exposed surfaces, not protected by a mask, are eroded by impact of silica beads. The blasting on the top surface of the support plate and/or blasting on any one or more local areas of the top surface may last for one or more predetermined period(s) of time to provide predetermined depths. In one embodiment, multiple areas between mesas are etched and have a same resultant depth.

The machining and/or blasting process is carried out over the mask(s) and support plate. Examples of blasting materials that may be used are a silicon carbide (SiC) based grinding material and an alumina ($Al_2O_3$) based grinding material. As an example, FIG. 9B shows a result of etching when two masks have been applied. FIG. 10B shows a result of a second iteration of etching after the second mask has been removed for the same support plate of FIG. 9B.

At 418C, the mask application controller 314 may determine whether a mask is to be removed. If a mask is to be removed operation 418D is performed, otherwise operation 418E is performed. At 418D, the uppermost mask is removed. This may include peeling away the uppermost mask.

At 418E, the machining controller 310 determines whether another depth pattern is to be formed. Another depth pattern is to be formed, for example, if another mask remains on the support plate. If another depth pattern is to be formed, operation 418B is performed, otherwise operation 418F may be performed.

At 418F, a soft-polishing controller 298 may perform soft-polishing. Soft-polishing includes rounding outer peripheral edges of the mesas to reduce stress concentrations at the edges and reduce surfaces roughness of the substrate support to reduce solid-to-solid lateral contact when slippage between the substrate and the substrate support occurs. The soft-polishing controller 298 estimates mesa edge radii (e.g., radius mr) and/or an amount of soft-polishing based on the amounts of substrate vertical deflections in the local regions of the substrate support. The phrase "soft-polishing" refers to the rounding of upper peripheral edges of mesas. Radii of the mesas and/or amounts of soft-polishing may be determined for polishing the upper peripheral edges to have the radii. The larger the radii, the more vertical deflection may occur. However, the larger the radii, the less localized stress at the edges of the mesas. Based on the determined vertical deflections, amounts of deflection at edges of the mesas may be determined. The radii and/or the amounts of soft-polishing may be determined based on the amounts of deflection at the edges of the mesas. The larger the vertical deflection of the substrate, the more the radius rl may be reduced. The method may end at 420.

The above-described operations are meant to be illustrative examples; the operations may be performed sequentially, synchronously, simultaneously, continuously, during overlapping time periods or in a different order depending upon the application. Also, any of the operations may not be performed or skipped depending on the implementation and/or sequence of events.

Figure 5:
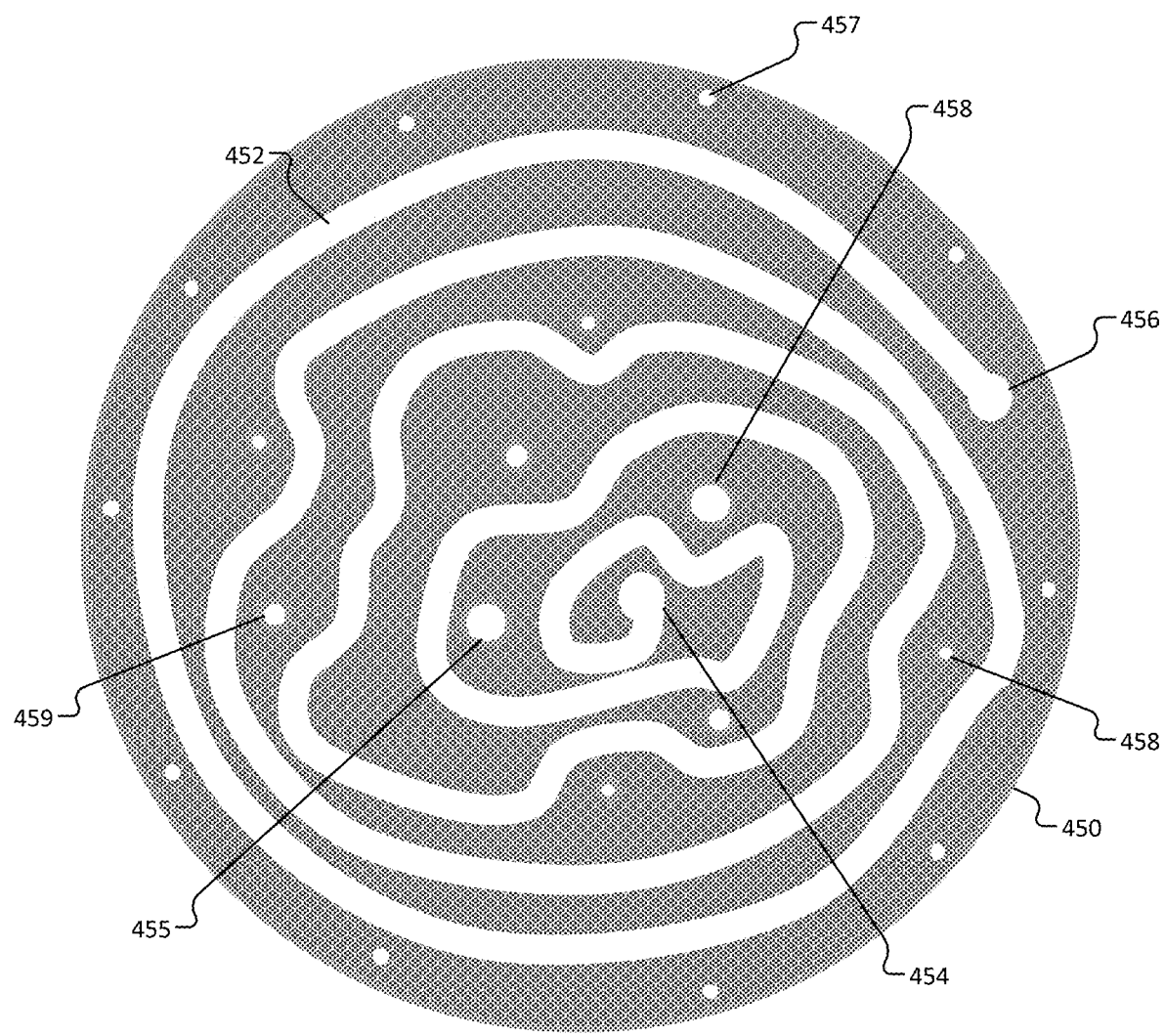
FIG. 5 is a top cross-sectional view of a base plate including a cooling channel.

FIG. 5 shows an example of a base plate 450 that includes a cooling channel 452. Although the baseplate 450 is shown as including a single cooling channel, the base plate may have any number of cooling channels. The baseplate 450 may be zoned, where each zone includes a respective cooling channel with a corresponding coolant inlet and coolant outlet. The cooling channel 452 is shown having a coolant inlet 454 at a center of the base plate 450 and a coolant outlet 456 near a circumference of the base plate 450. This provides more cooling at a center of a substrate, where higher heat loads may be experienced during plasma processing. The base plate 450 may also include any number of holes (e.g., holes 457, 458, and 459 are shown). The holes 455 are feedthroughs for temperature measurement. Temperature sensors may be connected to have corresponding electrical lines passing through the holes 455. The holes 457 are bolt holes near a periphery of the baseplate 450.

The holes 458 may include at least one supply hole and at least one return hole. The holes 458 may be used to pass gas through the base plate 450 to a support plate for circulation through open areas between mesas of the support plate. The holes 459 may be used for different purposes. The holes 459 may be used as electrical feedthroughs, such for providing a clamping voltage, heater connections, and RF delivery. In one embodiment, the diameters of the holes 459 are larger than the diameters of the holes 455. The diameters of the holes 455 may be larger than the diameters of the holes 457 and 458.

The cooling channel 452 provides a maximum amount of cooling at the center of the base plate 450. The amount of cooling decreases from the center to the circumference of the base plate 450, as the cooling fluid in the cooling channel 452 increases in temperature.

FIG. 6 shows a substrate support 500 that includes a seal band 502 and mesas 504. The seal band 502 includes an annular area (or zone) 506 that is separated from another area (e.g., inner area 508). The seal band 502 includes a first band 510 and a second band 512. Although the bands 510, 512 are shown as rings and are circular shaped, the bands 510, 512 may take on other shapes. The first band 510 is at a circumference of the substrate support 500 and/or corresponding support plate 514. The second seal band 512 has a smaller diameter than the first seal band 510 and is located closer to a center of the substrate support 500. The second band 512 separates the annular area 506 from the inner area (or non-seal band area) 508. The annular area 506 may be provided with gas at a higher pressure than gas provided to the inner area 508.

Referring now also to FIG. 7, which shows an example of a mask 520 over a portion of the substrate support 500 of FIG. 6. The mask 520, as shown, is annular in shape and includes an inner diameter and an outer diameter. The outer diameter of the mask 520 is a same size as an outer diameter of the substrate support 500. The mask 520 does not cover a circular area 522 of the support plate 514 defined by the inner diameter of the mask 520. The mask 520 covers the seal band area 506 and may cover a portion of the inner areas 508. Although shown as covering more than the seal band area 506, the inner diameter of the mask 520 may be increased to match or be similar to a diameter of the second band 512, such that the mask 520 covers only the seal band area 506.

FIG. 8 shows an example of a top surface area 550 of a support plate 551 of a substrate support. The top surface area 550 includes a seal band 552 and mesas (dots 554 are shown representing locations of the mesas). The seal band 552 includes bands 556, 558. A heating element and/or clamping electrode (not shown in FIG. 8) may be included in the support plate 551. As shown, mesas may exist within a seal band area between the bands 556, 558 and within a non-seal band area 564.

The following FIGS. 9A-9B and 10A-10B are shown for example purposes only and are not drawn to scale. The diameters of masks, the number of mesas, the sizes of mesas, and the depths of areas between mesas may be different than shown. Also, only some of the mesas shown in FIGS. 9A, 10A are shown in FIGS. 9B, 10B. FIGS. 9A-9B show a support plate 600. Multiple masks 602, 604 are shown on the support plate 600. FIGS. 9A-9B show an example of the support plate 600 subsequent to performing a first iteration of operation 418B of FIG. 4. The first mask 602 has a first pattern. The second mask 604 has a second pattern. The support plate 600 has been etched, based on the patterns of the masks 602, 604 to provide mesas 606. As can be seen, the second mask 604 prevents etching in a circular area within an annular area of the second mask 604. The first mask 602 has a more complex pattern to prevent etching in areas associated with the mesas 606. After the etching performed by the first iteration of the operation 418B, areas between the mesas 606 may have a first depth D1. The second mask 604 may cover only a seal band area 608 of the support plate 600 or may cover more than the seal band area 608.

FIGS. 10A-10B show the support plate 600 after the second mask 604 has been removed. FIGS. 10A-10B show an example of the support plate 600 subsequent to performing a second iteration of operation 418B of FIG. 4. Subsequent to performing the second iteration of operation 418B, areas between the mesas 606 may have a second depth D2, which may be larger than the first depth D1. Seal bands 620, 622 are formed during the second iteration of operation 418B. Areas within and external to the bands 620, 622 may have a third depth D3, which is smaller than the second depth D2. If the second mask 604 covers more than the seal band area 608 and the bands 620, 622, one or more areas between the band 622 and some of the mesas 606 may have multiple depths, as shown by areas 624, 626. The areas 624, 626 have step 628 corresponding to depths D2 and D3.

In one embodiment, the top surfaces of the mesas 606 and the bands 620, 622 are at a same height relative to a bottom of the support plate 600. As an example, the depth D2 may be 10 microns and the depth D3 may be 8 microns. The bands 620, 622 may form a continuous seal with a backside of a substrate. This provides a smaller depth in the seal band area 608 for increased cooling than in the area within the inner diameter of the band 622. In another embodiment, the depth D2 is equal to the depth D3 to provide uniform depths across the support plate 600. During operation, a cooling gas is provided to (i) the seal band area 608, (ii) the areas between the band 622 and the mesas 606, and (iii) areas between the mesas 606. As an example, the pressure of the cooling gas may be up to 80 Torr to conduct heat across the stated areas and to the upper surfaces of the support plate.

Reducing the depths D2, D3 can reduce temperatures of a substrate on the support plate, in the presence of an external heat load, as in a plasma reactor. As an example, reducing the depths D2, D3 from 10 microns to 9 microns can reduce the temperature of the substrate by 1° C. for 6 kW of power. This is because heat transfer across the stated areas (or gaps between the substrate and the support plate) is improved.

If a mesa height is near a mean free path of cooling gas atoms, the heat transfer coefficient hg from the top surface of the ceramic to the wafer may be represented by equation 2, where: kg is the thermal conductivity of the gas; d is a distance (the mesa height in our system) between the two surfaces; $g_1$ and $g_2$ represent thermal transfer at the interface in terms of an effectively greater gas gap distance; and hg is the heat transfer coefficient, such that a temperature drop across a gap can be represented by equation 3, where P is the heating power into the wafer and A is the heated area. The heating power P is proportional to the plasma power.

$$h_g = \frac{k_g}{(d + g_1 + g_2)} \quad (2)$$

$$T_{wafer} - T_{ceramic} = \frac{P}{h_g \cdot A} \quad (3)$$

For example, a rougher surface can be more effective at transferring heat than a smoother surface, due to the increased surface area for gas interaction. If surface condition remains constant and only mesa height changes, then $g_1$ and $g_2$ are constant. In this case, the temperature drop from wafer to ceramic surface is linearly proportional to the mesa height d and to the plasma power (or heat input power P, which is proportional to plasma power). This temperature drop may be represented by equation 4.

$$T_{wafer} - T_{ceramic} = P \cdot \frac{(d + g_1 + g_2)}{k_g} \cdot A \quad (4)$$

The improved heat transfer characteristics provided by the examples disclosed herein can reduce within-wafer temperature variation by 10-50%, which can improve substrate processing yield. In one embodiment, the depths are varied from between 8-15 microns, potentially allowing compensation of within-wafer non-uniformity of up to about 7° C. for 6 kW input power. By adjusting the depths across a support plate, sizes of the gaps between a substrate and the support plate are adjusted, which adjusts amounts of local cooling to control within-wafer temperature uniformity. The sizes of the gaps across a support plate are fully adjustable and are not as restricted by geometric considerations as other cooling adjustment methods, such as adjustment of cooling channels within a base plate. Also, unlike thickness of a thermal bond layer between a support plate and a base plate, the sizes of the gaps can be easily adjusted for local regions of a support plate.

In one embodiment, three or more masks are used. Each additional mask allows for different sized depths to be formed. The shorter the depth, the more cooling provided, which aids in cooling hot spots. The hot spots may be associated with areas not sufficiently cooled by the base plate and/or associated with thermal bond layer. The iteration of tasks 418A-418E allows for fine control of the depths across a support plate.

As an alternative, to iteratively performing tasks 418A-418E, the machining tool 312 may be used to locally provide predetermined depths. This implementation may be used, for example, when a depth pattern has a same symmetry as a blasting process. For example, this technique may be used if a support plate center-to-edge gradient in gap distance is needed, such that the sizes of gaps are to gradually decrease in size from a center of the support plate radially outward to the edge of the support plate. The machining tool 312 may be moved radially across the support plate from the center to the edge at an increasing rate, such that the machining tool 312 is machining for a maximum period of time at the center and for a minimum period of time near the edge. As a result, the center of the support plate is exposed longer to blasting than the edge of the support plate. The rate of radial movement and/or periods of time over areas of the support plate may be predetermined and stored in the memory 278 prior to performing this method.

Figure 11:
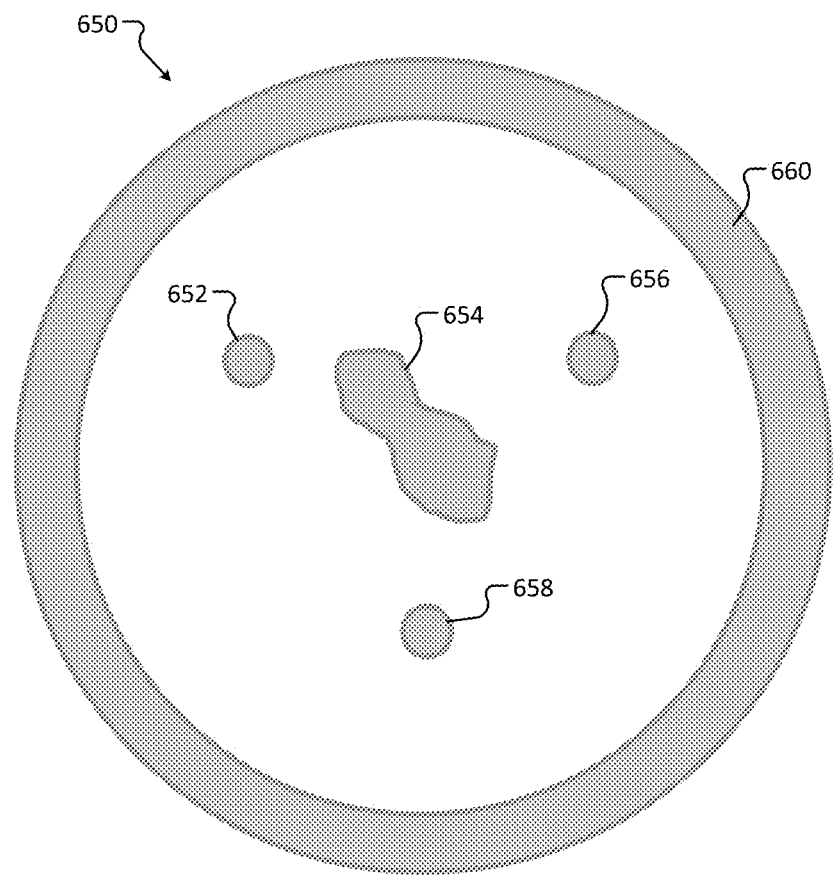
FIG. 11 is a top view of a support plate illustrating examples of custom local masks in accordance with an embodiment of the present disclosure.

FIG. 11 shows a support plate 650 illustrating examples of custom local masks 652, 654, 656, 658. The masks 652, 654, 656, 658 may have various shapes and may be located within an inner diameter of an outer annular mask 660.

The disclosed examples provide enhanced local improvement in cooling power uniformity, which improves substrate temperature uniformity. By providing temperature uniformity across substrates, the above-described examples reduce substrate-to-substrate variability. The depths of the support plate surface features can be customized for specific applications and precisely controlled for setting local depths.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A method comprising:
   determining a temperature distribution pattern across a substrate or a support plate of a substrate support;
   determining, based on the temperature distribution pattern, a number of masks to apply to a top surface of the support plate, wherein the number of masks is greater than or equal to two;
   determining patterns of the masks based on the temperature distribution pattern;
   applying the masks over the top surface of the support plate;
   performing a first machining process to remove a portion of the support plate unprotected by the masks to form first mesas and first recessed areas between the first mesas;
   removing a first one of the masks from the support plate;
   performing a second machining process to form second recessed areas and a first seal band area, wherein the second machining process to form the first seal band area includes forming a pair of seal bands of the first seal band area, wherein the second machining process includes increasing depths of the first recessed areas, and wherein, subsequent to performing the second machining process, the depths of the first recessed areas are greater than the depths of the second recessed areas; and removing a second one of the masks from the support plate.

2. The method of claim 1, wherein the first seal band area is formed during the second machining process.

3. The method of claim 1, wherein the performing of the second machining process includes forming second mesas.

4. The method of claim 3, wherein heights of the first mesas, heights of the second mesas and heights of bands of the first seal band area are at a same level relative to a bottom of the support plate.

5. The method of claim 3, further comprising:
performing a third machining process to form at least one of third mesas and a second seal band area; and
removing a third one of the masks from the support plate.

6. The method of claim 1, further comprising determining at least one of patterns, an application order and a removal order of the masks based on the temperature distribution pattern.

7. The method of claim 1, further comprising:
determining a baseplate cooling pattern of the substrate support; and
determining, based on the baseplate cooling pattern of the substrate support, at least one of the number of masks, patterns of the masks, an application order of the masks and a removal order of the masks.

8. The method of claim 1, further comprising:
determining a cooling pattern of the support plate; and
determining, based on the cooling pattern of the support plate, at least one of the number of masks, patterns of the masks, an application order of the masks and a removal order of the masks.

9. The method of claim 8, further comprising:
determining a heat transfer distribution pattern across the support plate based on seal band locations and the cooling pattern of the support plate; and
determining, based on the heat transfer distribution pattern, the at least one of the number of masks, the patterns of the masks, the application order of the masks and the removal order of the masks.

10. The method of claim 1, further comprising:
determining plasma patterns across the support plate; and
determining, based on the plasma patterns across the support plate, at least one of the number of masks, patterns of the masks, an application order of the masks and a removal order of the masks.

11. The method of claim 1, further comprising:
identifying hot and cold spots of the support plate having irregular temperatures as compared to surrounding areas across the support plate; and
determining, based on the hot and cold spots, at least one of the number of masks, patterns of the masks, an application order of the masks and a removal order of the masks.

12. The method of claim 1, further comprising:
estimating at least one areal density of a plurality of mesas across at least a portion of the support plate, the plurality of mesas including the first mesas; and
determining, based on the at least one areal density of the plurality of mesas, at least one of the number of masks, patterns of the masks, an application order of the masks and a removal order of the masks.

13. The method of claim 1, further comprising:
determining at least one of a mesa configuration, a distribution pattern of mesas, and a pattern of depths of areas between mesas; and
based on the at least one of the mesa configuration, the distribution pattern of mesas, and the pattern of depths of areas between mesas, determining at least one of the number of masks, patterns of the masks, an application order of the masks and a removal order of the masks.

14. The method of claim 1, wherein the pair of seal bands define a radially inner annular side and a radially outer annular side of the first seal band area.

15. The method of claim 1, wherein, during the second machining process, a depth between adjacent ones of the first recessed areas is increased and one of the second recessed areas is formed between the adjacent ones of the first mesas.

16. A method comprising:
determining a temperature distribution pattern across a substrate or a support plate of a substrate support;
determining, based on the temperature distribution pattern, a number of masks to apply to a top surface of the support plate, wherein the number of masks is greater than or equal to two;
determining patterns of the masks based on the temperature distribution pattern;
applying the masks over the top surface of the support plate;
performing a first machining process to remove a portion of the support plate unprotected by the masks to form first mesas and first recessed areas between the first mesas;
removing a first one of the masks from the support plate;
performing a second machining process to form second recessed areas, second mesas and a first seal band area, wherein the second mesas are separate from the first mesas; and
removing a second one of the masks from the support plate.

17. The method of claim 16, wherein the second machining process includes increasing depths of the first recessed areas.

18. The method of claim 16, wherein, subsequent to performing the second machining process, depths of the first recessed areas are greater than depths of the second recessed areas.

19. The method of claim 16, wherein:
the second machining process includes increasing depths of the first recessed areas; and
subsequent to performing the second machining process, the depths of the first recessed areas are greater than the depths of the second recessed areas.

20. The method of claim 16, further comprising determining at least one of patterns, an application order and a removal order of the masks based on the temperature distribution pattern.

21. The method of claim 16, further comprising:
determining a baseplate cooling pattern of the substrate support; and
determining, based on the baseplate cooling pattern of the substrate support, at least one of the number of masks, patterns of the masks, an application order of the masks and a removal order of the masks.

22. The method of claim 16, further comprising:
determining a cooling pattern of the support plate; and
determining, based on the cooling pattern of the support plate, at least one of the number of masks, patterns of the masks, an application order of the masks and a removal order of the masks.

23. The method of claim 22, further comprising:
determining a heat transfer distribution pattern across the support plate based on seal band locations and the cooling pattern of the support plate; and determining, based on the heat transfer distribution pattern, the at least one of the number of masks, patterns of the masks, the application order of the masks and the removal order of the masks.

24. The method of claim 16, further comprising:
determining plasma patterns across the support plate; and
determining, based on the plasma patterns across the support plate, at least one of the number of masks, patterns of the masks, an application order of the masks and a removal order of the masks.

25. The method of claim 16, further comprising:
identifying hot and cold spots of the support plate having irregular temperatures as compared to surrounding areas across the support plate; and
determining, based on the hot and cold spots, at least one of the number of masks, patterns of the masks, an application order of the masks and a removal order of the masks.

26. The method of claim 16, further comprising:
estimating at least one areal density of a plurality of mesas across at least a portion of the support plate, the plurality of mesas comprising the first mesas and the second mesas; and
determining, based on the at least one areal density of the plurality of mesas, at least one of the number of masks, patterns of the masks, an application order of the masks and a removal order of the masks.

27. The method of claim 16, wherein the first machining process is performed after applying the masks.

28. The method of claim 16, wherein the second mesas have a same height relative to a bottom of the support plate as the first mesas.

29. The method of claim 16, wherein the second machining process includes deepen depths between the first mesas.

\* \* \* \* \*